United States Patent [19]

Yuzawa

[11] Patent Number: 5,621,653
[45] Date of Patent: Apr. 15, 1997

[54] METHOD OF AND AN APPARATUS FOR CONVERTING LAYOUT DATA IN CONDUCTIVE PORTIONS

[75] Inventor: Naoki Yuzawa, Kawasaki, Japan

[73] Assignee: Fujitsu Limited, Kawasaki, Japan

[21] Appl. No.: 497,133

[22] Filed: Jun. 30, 1995

Related U.S. Application Data

[63] Continuation of Ser. No. 79,915, Jun. 23, 1993, abandoned.

[30] Foreign Application Priority Data

Jun. 23, 1992 [JP] Japan ................................. 4-164915
Jun. 21, 1993 [JP] Japan ................................. 5-149382

[51] Int. Cl.$^6$ ............................................. G06F 17/50
[52] U.S. Cl. ........................................ 364/491; 364/490
[58] Field of Search ................................. 364/488, 489, 364/490, 491

[56] References Cited

U.S. PATENT DOCUMENTS

| | | | |
|---|---|---|---|
| 3,702,004 | 10/1972 | Eskew et al. | 364/490 |
| 4,500,963 | 2/1985 | Smith et al. | 364/489 |
| 4,615,001 | 9/1986 | Linsker | 364/491 |
| 4,636,965 | 1/1987 | Smith et al. | 364/491 |
| 4,803,636 | 2/1989 | Nishiyama et al. | 364/491 |
| 4,965,739 | 10/1990 | Ng | 364/491 |
| 5,067,091 | 11/1991 | Nakazawa | 364/490 |
| 5,247,456 | 9/1993 | Ohe et al. | 364/491 |
| 5,267,177 | 11/1993 | Sato et al. | 364/491 |
| 5,353,235 | 10/1994 | Do et al. | 364/491 |

FOREIGN PATENT DOCUMENTS

| | | |
|---|---|---|
| 2-181272 | 7/1990 | Japan. |
| 4-115367 | 4/1992 | Japan. |

Primary Examiner—Kevin J. Teska
Assistant Examiner—Thai Phan
Attorney, Agent, or Firm—Staas & Halsey

[57] ABSTRACT

An method of, and an apparatus for, converting layout data of a conductive portion is obtained in which conversion of layout data of the conductive portion is automatically performed in a reduced processing time, designing is performed efficiently, and development stages are reduced in number. The layout data conversion apparatus comprises a basic pattern unit (basic layout pattern), a storage means 1, a design rule memory means 2, a means for storing information about connection between basic pattern units 3, a basic layout pattern generation means 4, a connection determination means 5 for determining whether conductive portions are connected to each other a layer information determining means 6, an element configuration change means 7, a means for detecting and eliminating violation of design rules 8, a means for storing and displaying layout pattern arrangement result information 9, and a computation control means 10 for controlling operations of these means.

13 Claims, 14 Drawing Sheets

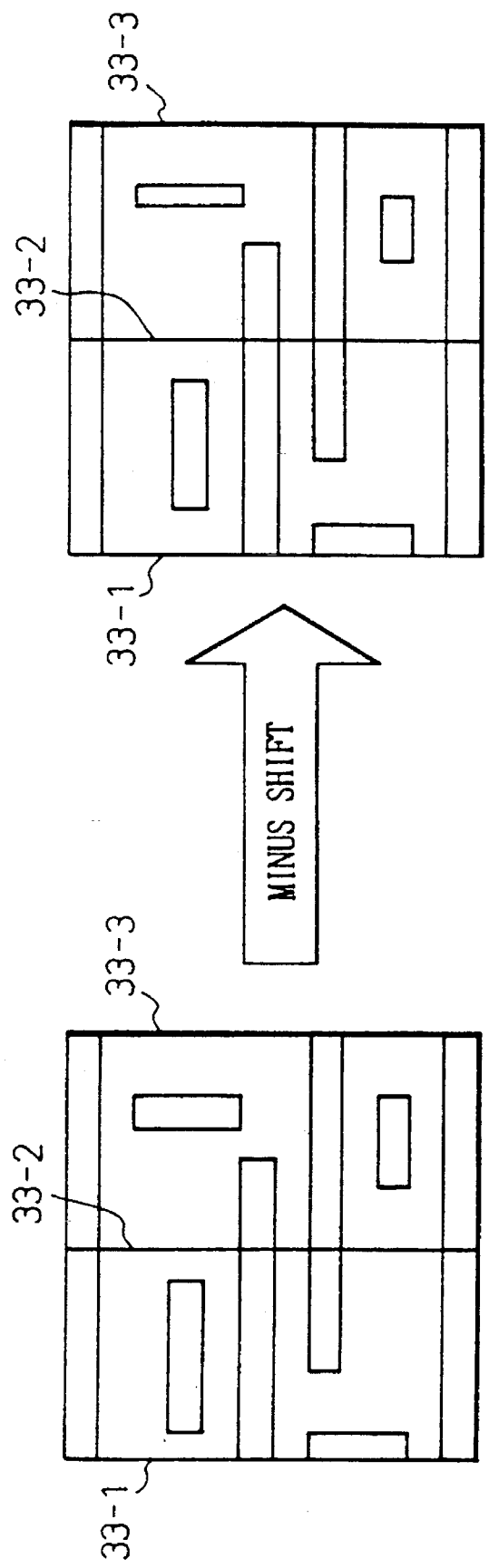

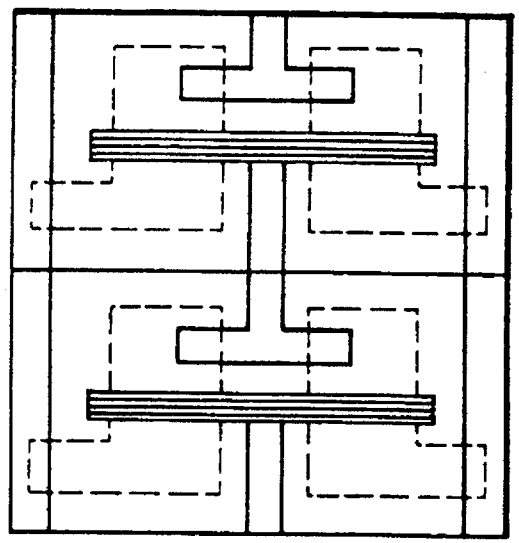
Fig.3A
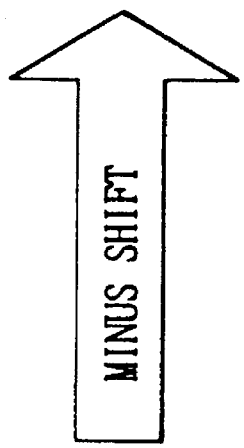
MINUS SHIFT
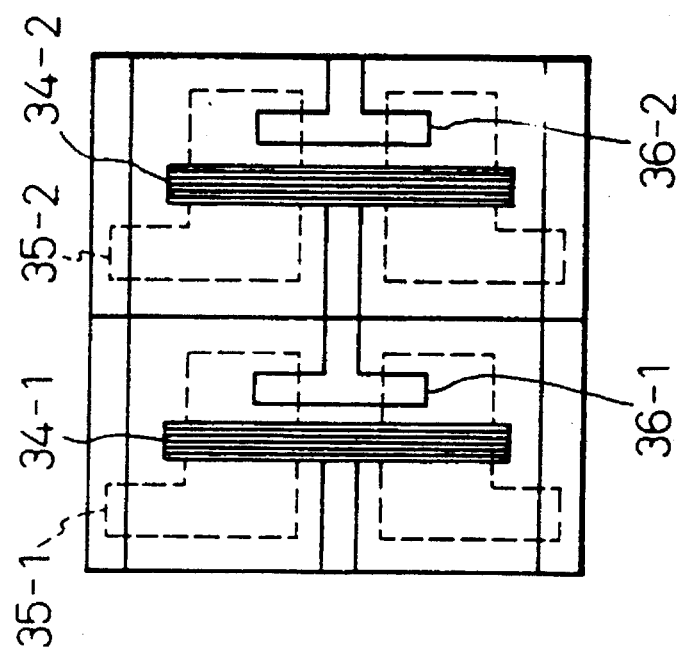
Fig.3B

EMBODIMENT

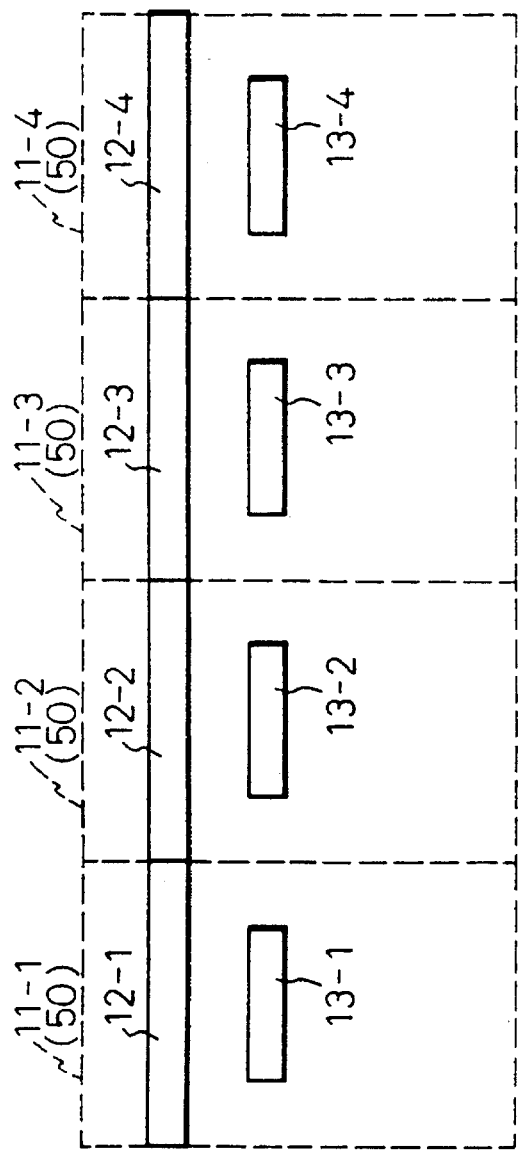
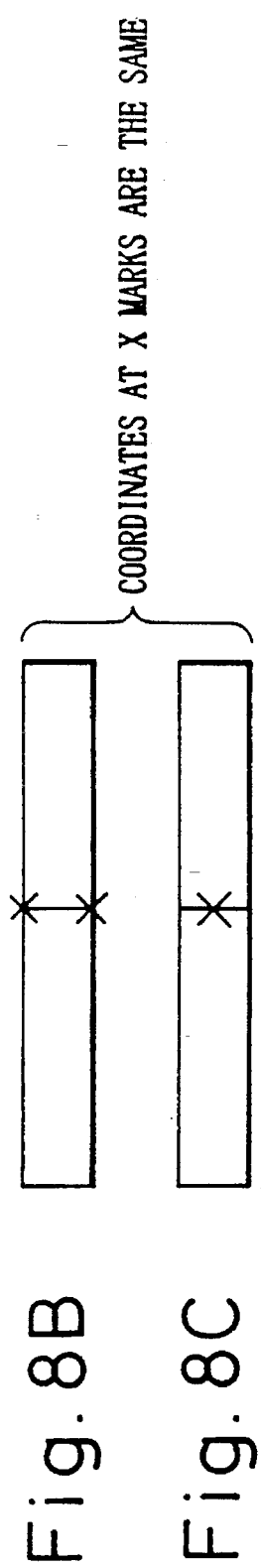
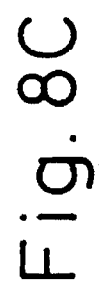
Fig.8A
Fig.8B
Fig.8C
Fig.8D

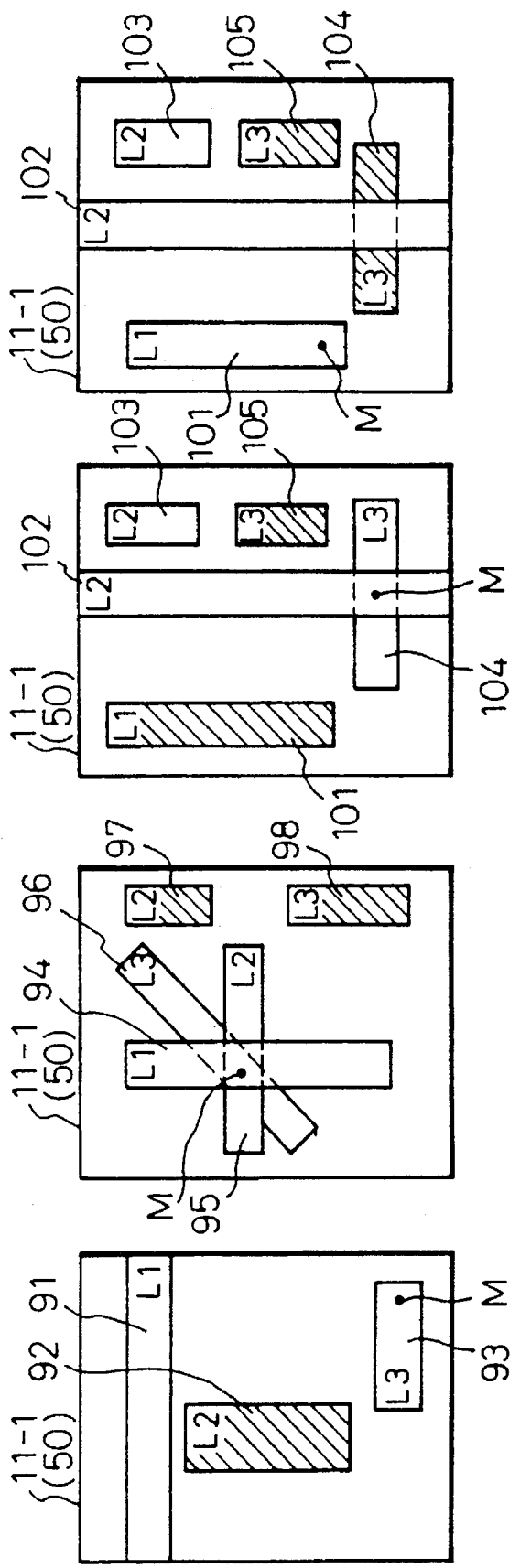

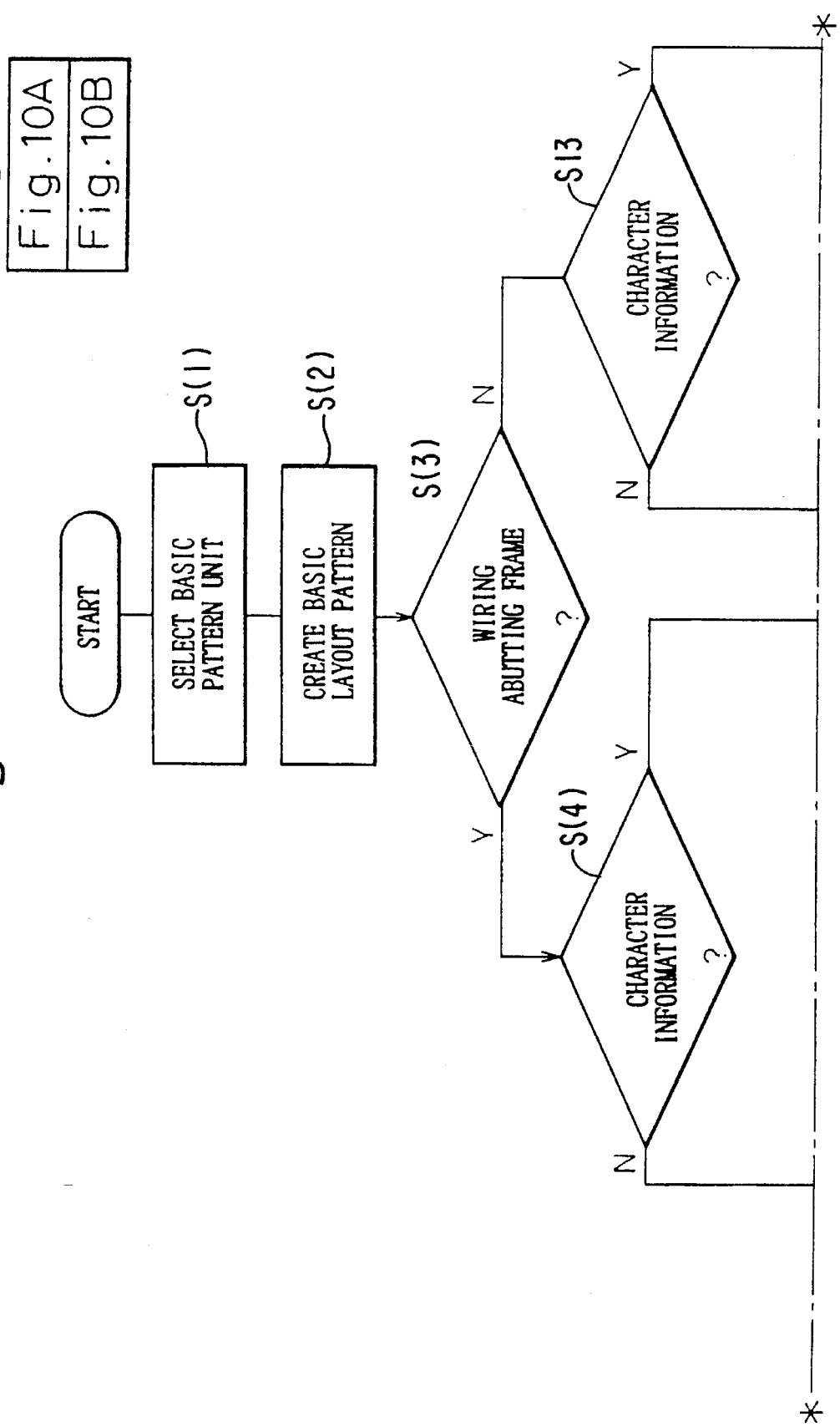

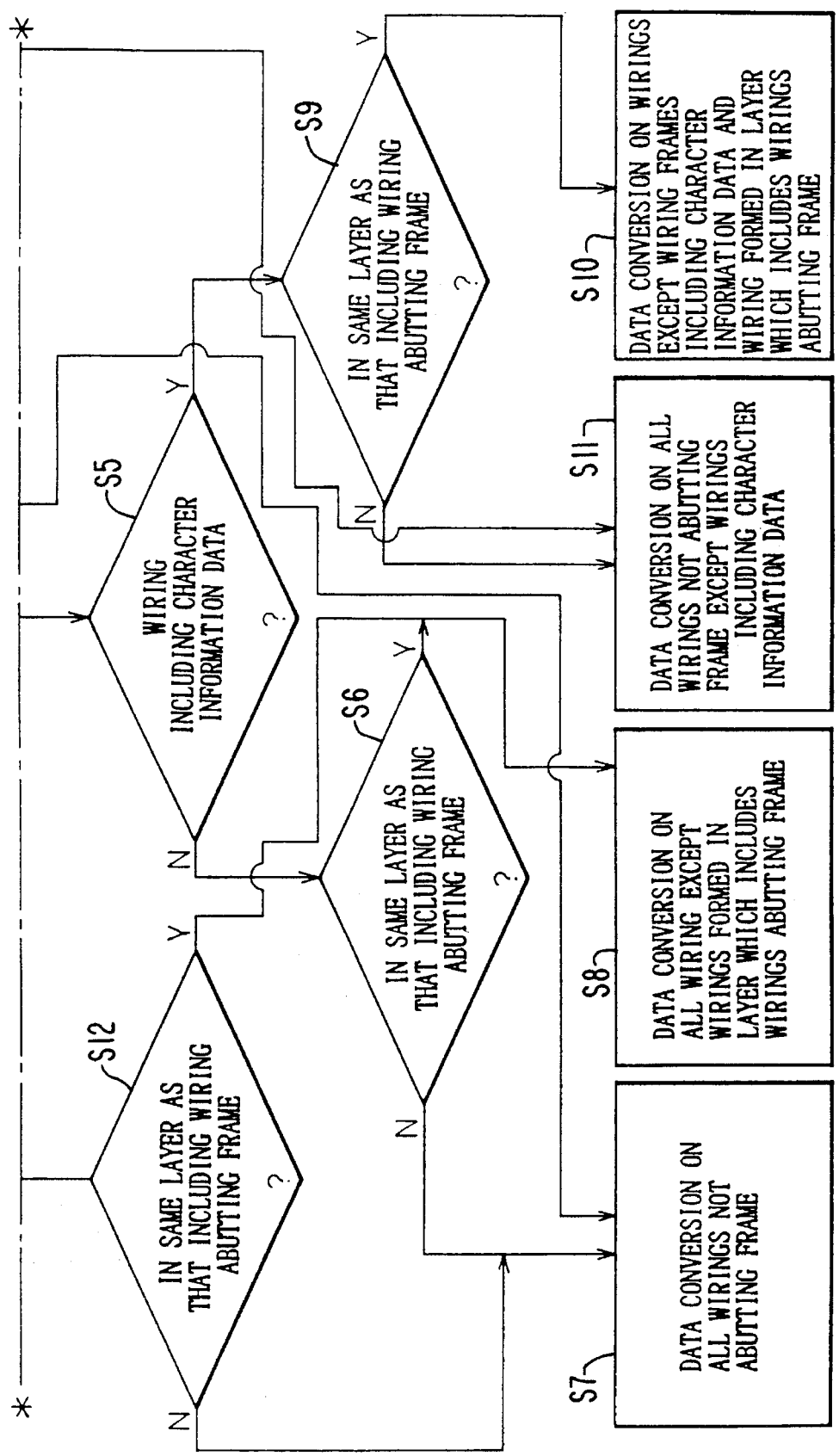

METHOD OF AND AN APPARATUS FOR CONVERTING LAYOUT DATA IN CONDUCTIVE PORTIONS

This application is a continuation of application Ser. No. 08/079,915, filed Jun. 23, 1993, now abandoned.

BACKGROUND OF THE INVENTION

1. Field of the Invention

The present invention relates to a layout data conversion method in which layout data need not be amended even when the design of, for example, a standard-cell type semiconductor integrated circuit is changed. And more particularly, it relates to a semiconductor integrated circuit which uses a digital type standard cell.

2. Description of the Related Art

In designing a semiconductor integrated circuit, data which were used in designing a previous circuit are preferably utilized to increase the density of the semiconductor integrated circuit. However, if the data are simply converted, there will arise problems including deterioration in the shapes of patterns and separation of wiring or the like from a predetermined connection portion to which the wiring is supposed to be connected. Hence, major corrections must be made to the data. Under the circumstances, there is a need for a layout data conversion method in which only little correction of data is needed after data conversion.

In designing a semiconductor integrated circuit, especially at a layout designing step, logic gates are arranged and interconnected based on connection information which is created when the logic is designed and the logic cell library which is used. During the layout designing step, it is necessary to reduce the chip area as much as possible while satisfying constraints which are imposed due to fabrication conditions.

Over the past few years, as the need for larger semiconductor integrated circuits and more efficient designs has increased, a designing method which makes it possible to design a very dense circuit in a short time has been sought. To this end, designers repeatedly shift + reduce layout data which were used in designing previous semiconductor integrated circuits, in particular, the patterns of basic pattern units of the previous circuits, to thereby reduce the time which is required in designing new circuits.

The "shift" term herein refers to reduction in the size in a vertical direction or a horizontal direction during repeated use of layout data. The "reduce" term herein refers to general even reduction of data with one point of the data as the center of reduction.

FIG. 5 is a view showing an example of data conversion achieved by conventional shift. In FIG. 5, there is illustrated a case where original layout data of FIG. 5A in which patterns of basic pattern units are repeatedly used are subjected to horizontal minus shift to obtain similar repeated patterns in which the area of each basic pattern unit of a circuit is reduced, thereby obtaining layout data such as that shown in FIG. 5B. In FIG. 5A, a wiring of a basic pattern unit is shown in a rectangular shape. In this case, cells which are adjacent to each other form a pair, whereby a data set is obtained. If a minus shift is simply performed, wiring of adjacent cells which used to be in contact to each other at four positions will be separated from each other as shown in FIG. 5B, which makes it impossible to use the layout data as they are in FIG. 5B at a subsequent designing step. It then follows that the layout data of FIG. 5B must be corrected.

Manual layout or solid-merge-shift can be adopted as correction means. The former is to correct connection using a CAD tool. According to the latter approach, since left data and right data of FIG. 5A, for example, can be regarded as separate parts even through they are in contact with each other, they are treated as one horizontally long data (i.e., treated as one solid pattern), and two points in a vertical direction are selected at each end of the elongation of the pattern so that data are picked up only at these selected four points (i.e., merging). Following this, these data are subjected to minus shift. Hence, a pattern which is obtained by shift is equal to the original pattern as it is reduced in the horizontal direction, and therefore, no space is created in the center of the post-shift pattern.

The former means, requiring manual labor to perform correction, takes time. On the other hand, the latter means demands that data are partially deleted to be used as data of a long pattern, and hence, if data that are processed are taken into consideration, an increased amount of data must be used.

As such a method of converting layout data of a semiconductor integrated circuit device described above, Japanese Unexamined Patent Publication (KOKAI) No. 2-181272 published on Jul. 16, 1990, is known, for instance. However, this prior art only discloses a method of converting wiring data into loop data in the case where data about optional wiring are stored as line data in layout data. In this prior art, no consideration is taken at all as to inconvenience, due to conversion of a portion of wiring data, of the disconnections that may be created in adjacent wiring. The prior art does not disclose how to deal with such inconvenience.

Another Japanese Unexamined Patent Publication (KOKAI) No. 4-115367 published on Apr. 16, 1992, is directed to a layout pattern designing apparatus for designing an analog LSI function cell. According to the disclosed method of designing a layout pattern, data on basic cells are first prepared which have a plurality of types of circuit structures and element values. At the same time, a data changeable range is designated for each basic cell. After considering the changeable ranges of electric characteristics of an analog circuit and the configurations of elements, a basic layout pattern is generated.

Next, a basic cell which needs a change in the configuration or the element value is corrected, followed by determinationment as to violation of design rules. If it is determined that there is violation of the design rules, necessary correction is repeatedly performed until the violation of the design rules is eliminated.

Since the conventional method above is related to a layout pattern designing apparatus for designing an analog LSI function cell, a number of wiring parts and element parts are used and the interconnections between these parts are complex. Hence, even a partial change in the wiring parts and the element parts influences many other parts. This makes it necessary to change many other parts, consequently degrading design efficiency. In addition, since the basic cells are changed one at a time, the changes become complicated, which then take an enormously long time to implement.

Further, in the conventional art above, since the basic cells are treated simply in a plane, it is necessary to define various conditions of the changeable range for each basic cell. Hence, computation becomes complex and takes a long time.

SUMMARY OF THE INVENTION

The present invention solves these problems. It is an object of the present invention to offer an improved method of, and an improved apparatus for, converting layout data of a conductive portion, in which conversion of layout data of the conductive portion is automatically performed in a reduced processing time, designing is performed efficiently, and development stages are reduced in number.

It is other object of the present invention to offer an improved method of, and an improved apparatus for, converting layout data of a conductive portion of a semiconductor integrated circuit, primarily, a conductive portion of a digital LSI.

The present invention has been made to solve the problems described above. In a data conversion method to produce a design for a semiconductor integrated circuit, a desired number of desired basic pattern units are selected from a pattern unit storage part, called a cell library, for storing therein a plurality of basic pattern units which are different from each other, and arranged to generate temporary layout data and data conversion such as predetermined reduction and shift is performed. More particularly, in a layout data conversion method according to a first aspect of the present invention, in performing predetermined data conversion to correct design data for a semiconductor integrated circuit, which is designed by the steps of; joining basic pattern units which are selected from a pattern unit storage part in which a plurality of basic pattern units having different conductive arrangement patterns are stored, and forming a preliminary design of a semiconductor integrated circuit then converting the data, in this preliminary design thereof, if conductive portions, each arranged in respective basic pattern unit which are adjacently arranged to each other, are mutually connected to each other through a border line formed there between, data conversion is not performed on these adjacently arranged conductive portions, while, the data conversion is not performed on a conductive portion of one of the basic pattern units, which is in contact with a conductive portion of the another basic pattern units adjacently arranged to the former, but the data conversion is performed on a conductive portion of one of the basic pattern units and which is not in contact with the conductive portion of the other basic pattern unit adjacently arranged to the former.

In other words in the layout data conversion method for converting layout which includes a conductive portion according to the present invention, if figures of conductive portions which are shown as adjacent basic pattern units are arranged in contact with each other, the data conversion by means of reduction and shift will not be performed. If the figures of the conductive portions which are shown as the adjacent basic pattern units are arranged without being connected to each other, the data conversion by means of reduction and shift will be performed on the wiring of those conductive portions.

In a layout data conversion method according to a second aspect of the present invention, in performing predetermined data conversion to correct design data of a semiconductor integrated circuit which is designed by joining proper basic pattern units which are selected from a pattern unit storage part in which a plurality of basic pattern units having different conductive arrangement patterns are stored, an imaginary frame portion is formed which surrounds each basic pattern unit of the design data, and if there is a conductive portion which is contained within and in contact with the imaginary frame portion, data conversion is not performed on this conductive portion but is only performed on a conductive portion which is not in contact with the imaginary frame portion.

That is, the data conversion method according to the second aspect of the present invention is effective in designing layout data which has a cell level hierarchic structure, a block level hierarchic structure and a chip level hierarchic structure, and is also effective in processing the layout data. In the data conversion method for performing data conversion by means of reduction and shift on layout data according to the second aspect of the present invention, at the periphery of a layout figure of adjacent basic block data of the semiconductor integrated circuit, a frame is disposed to surround the basic block data. The data conversion by means of reduction and shift will not be performed on a conductive portion figure which is shown as a basic pattern unit which is located within and in contact with the frame, but will be performed on other data.

In the first aspect of the present invention, of layout data from a cell library which is used in designing semiconductor integrated circuits, if basic pattern units 11-1 and 11-2 are arranged with their conductive portions connected to each other at a portion C, the data conversion by means of reduction and shift will not be performed. The data conversion will be performed only if at layers which are different from the 10 layer which includes these conductive portions, the basic patterns are not connected to conductive portions of adjacent basic pattern units. As shown in FIG. 1A, data about portions 31-1 to 31-4 which are encircled by oval circles will not be converted by shift or reduction during minus shift which is performed to obtain data such as that shown in FIG. 1B, since the conductive portions of the basic patterns are formed in the same layer and in contact with conductive portions of other basic patterns.

When conductive portions of basic patterns are connected to each other but there is a conductive portion 17 which does not belong to the layer in the conductive portions 31-1 to 31-4 of the basic pattern units the conductive portion 17 is not connected to conductive portions of other adjacent basic patterns and the data conversion will be performed by executing reduction and shift. However, if the conductive portion 17 of the basic pattern unit 11-1 belongs to the layer in which the conductive portions 12-1, 14-1 and 19-1 are formed, the conductive portion 17 will not be subjected to data conversion.

In contrast when conductive portions 13-1 and 17 of the basic pattern unit 11-1 and conductive portions 13-2 and 18 of the basic pattern unit 11-2 are all not formed in the layer in which conductive portions 12-1, 12-2, 14-1, 14-2, 15-1, 15-2, 19-1 and 19-2 are formed, the data conversion will be performed as long as these conductive portions are not connected to other adjacent basic patterns.

In the second aspect of the present invention, layout data having a hierarchic structure are used. At the periphery of a layout figure of adjacent basic block data of the semiconductor integrated circuit, in particular, frames 33-1 to 33-3 surrounding the basic pattern units are formed. On basic pattern units which are located within and in contact with the frames, that is, the figures of the conductive portions which are shown as the basic pattern units, the data conversion by means of reduction and shift will not be performed. Instead, the data conversion will be performed on other conductive portions which are formed in a layer which is different from the layer which includes these conductive portions which are connected to the frames. FIG. 2A shows such a case before the data conversion and FIG. 2B shows a state as it is after the data conversion. That is, since the data conversion is performed according to a rule which prohibits shift of the conductive portions which are in contact with the cell frame 33-1 and the like of the basic pattern units, the data conversion would not create disconnection in a pattern which is formed by adjacent cells. This largely reduces the number of correction steps.

Next, a third aspect of the present invention will be described. In a layout data conversion method according to the third aspect of the present invention, character information data are registered in the conductive portion arranged in a respective basic pattern units or in at least a portion of layout data which are formed by combining a plurality of the basic pattern units. In that, if the character information data are registered, in the conductive portion of the basic pattern units or the layout data which are formed by combining the basic pattern units, the data conversion is not performed on all of the conductive portions in the basic pattern unit, regardless of the conductive portions, being arranged in different layers from each other and which include positional information in which coordinate value data of the character information are set. While with respect to conductive portions of all basic pattern units or the layout data which are formed by combining the basic pattern units which do not include the positional information in which coordinate value data of the character information are set, independently of differences in layers the data conversion is performed on these conductive portions. However the conductive portion should not be connected to the conductive portions of the adjacent basic pattern units of the layout data or it should be conductive portions other than a conductive portion which is in contact with the imaginary frame portion.

BRIEF DESCRIPTION OF THE DRAWINGS

FIGS. 2A and 2B are views for explaining an example of layout data conversion according to the second aspect of the present invention;

FIGS. 3A and 3B are views for explaining a preferred embodiment of layout data conversion according to the second aspect of the present invention;

FIGS. 8A to 8B are views for explaining an example of a method of determining whether conductive portions are connected to each other in the layout data conversion method of the present invention;

FIGS. 9(A) to 9(D) are views showing examples of conductive portions which can be converted by data conversion of the present invention;

FIGS. 10, 10(A) and 10(B) are flow charts for explaining procedures for performing the layout data conversion method of the present invention;

DETAILED DESCRIPTION OF THE PREFERRED EMBODIMENT

Figure 1A:
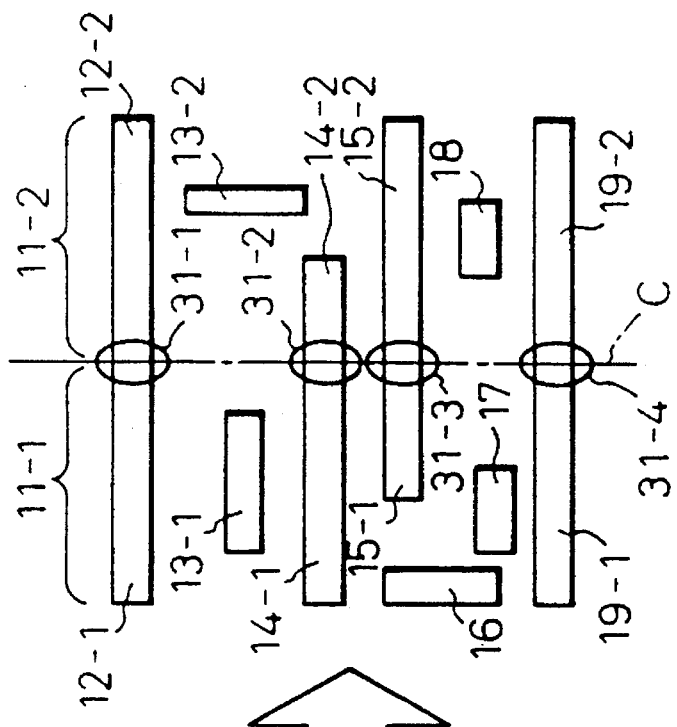
FIGS. 1A and 1B are views for explaining an example of layout data conversion according to the first aspect of the present invention.

In the following, a method of, and an apparatus for, converting layout data of a conductive portion according to the present invention will be described in detail with reference to the drawings.

FIG. 3 is a view for schematically explaining an example of the second aspect of the present invention as a preferred embodiment of the present invention.

FIG. 3A is a layout view prior to shift while FIG. 3B is a layout view after shift. Gate electrodes are indicated at reference numerals 34-1 and 34-2, diffusion layers are indicated at reference numerals 35-1 and 35-2, and aluminum wiring is indicated at reference numerals 36-1 and 36-2. In the case of FIG. 3B, the horizontal widths of the gate electrode 34-1 and the like and the lengths of the diffusion layer 35-1 and the like are shortened in a horizontal direction each by a small amount.

In other words, it is a premise in the illustrated example that the gates 34-1 and 34-2 are formed in a layer which is different from a layer in which other conductive portions are formed.

Figure 4:
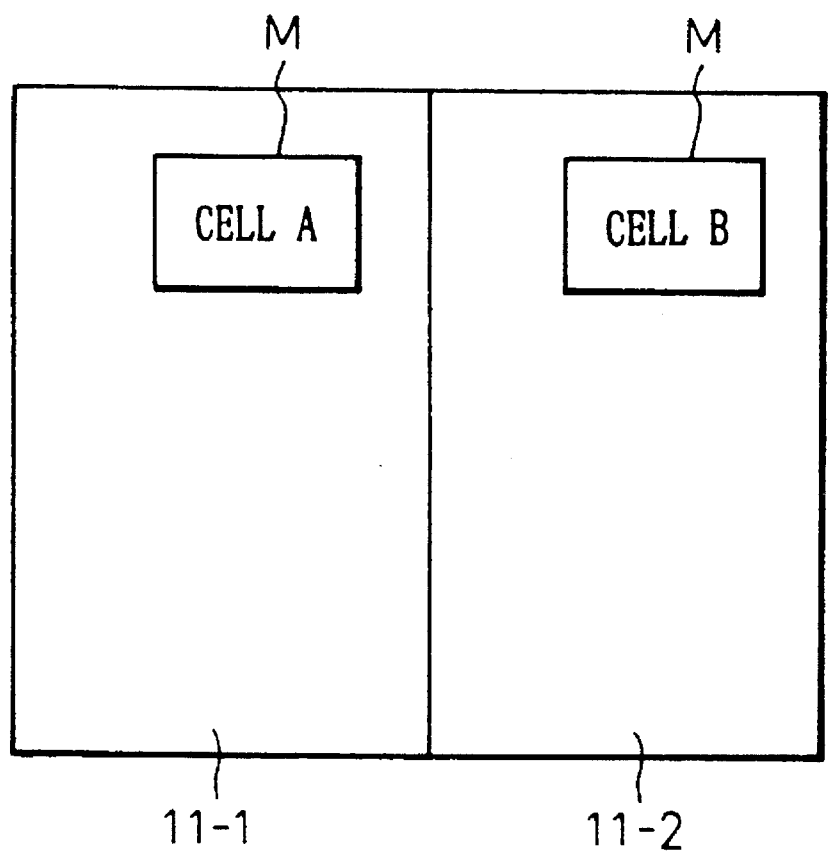
FIG. 4 is a view for explaining an example of layout data conversion according to the third aspect of the present invention.
Figure 5A:
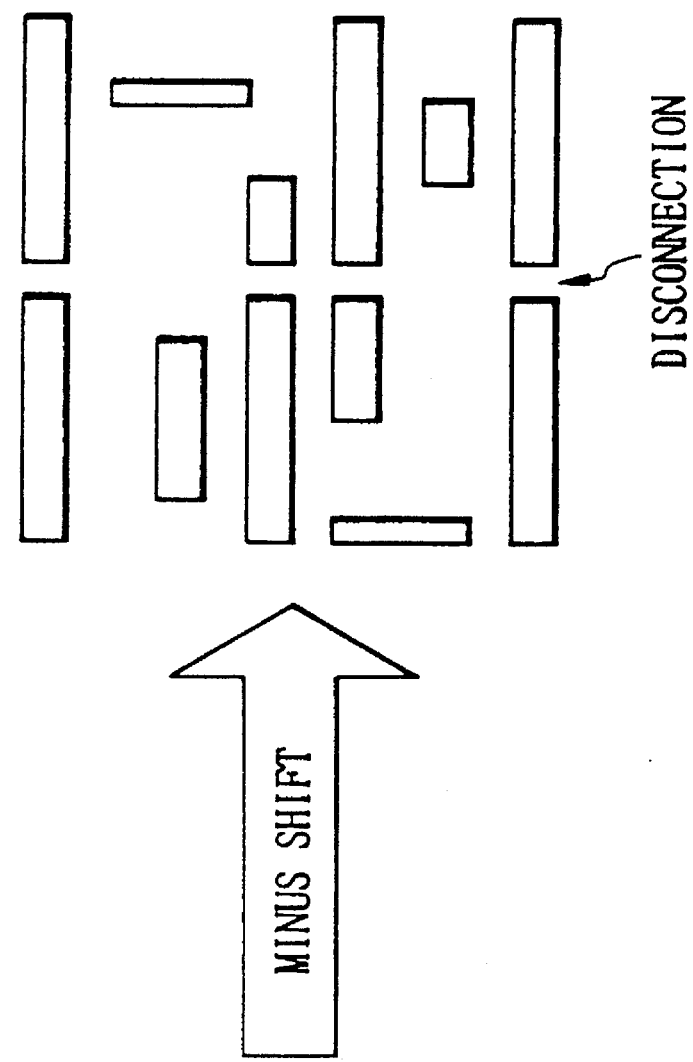
FIGS. 5A and 5B are views for explaining the prior art.
Figure 5B:
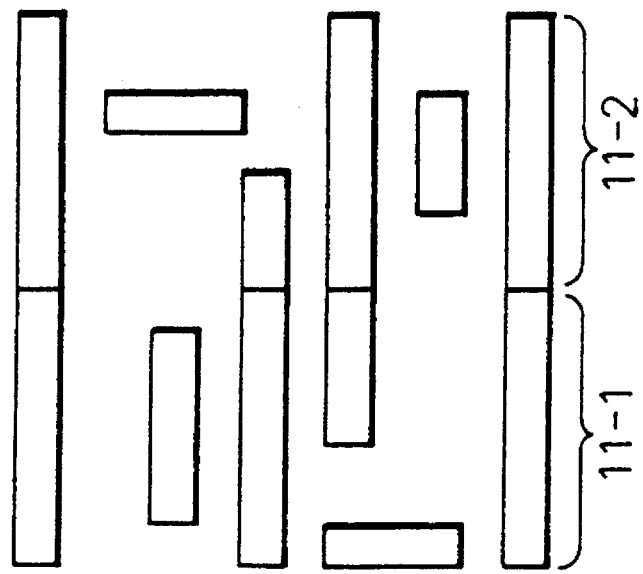

Next, in FIG. 4, there is illustrated an example where character information data M such as a cell name are described in the layout data conversion method of the third aspect of the present invention.

The reference character M denotes character data which must not be converted to avoid a change in the location at which the character data are displayed due to a change in the location of the character data. The character data are not printed on a final product.

Next, a more detailed description will be given on the method of, and the apparatus for, converting layout data of a conductive portion according to the present invention.

Figure 6:
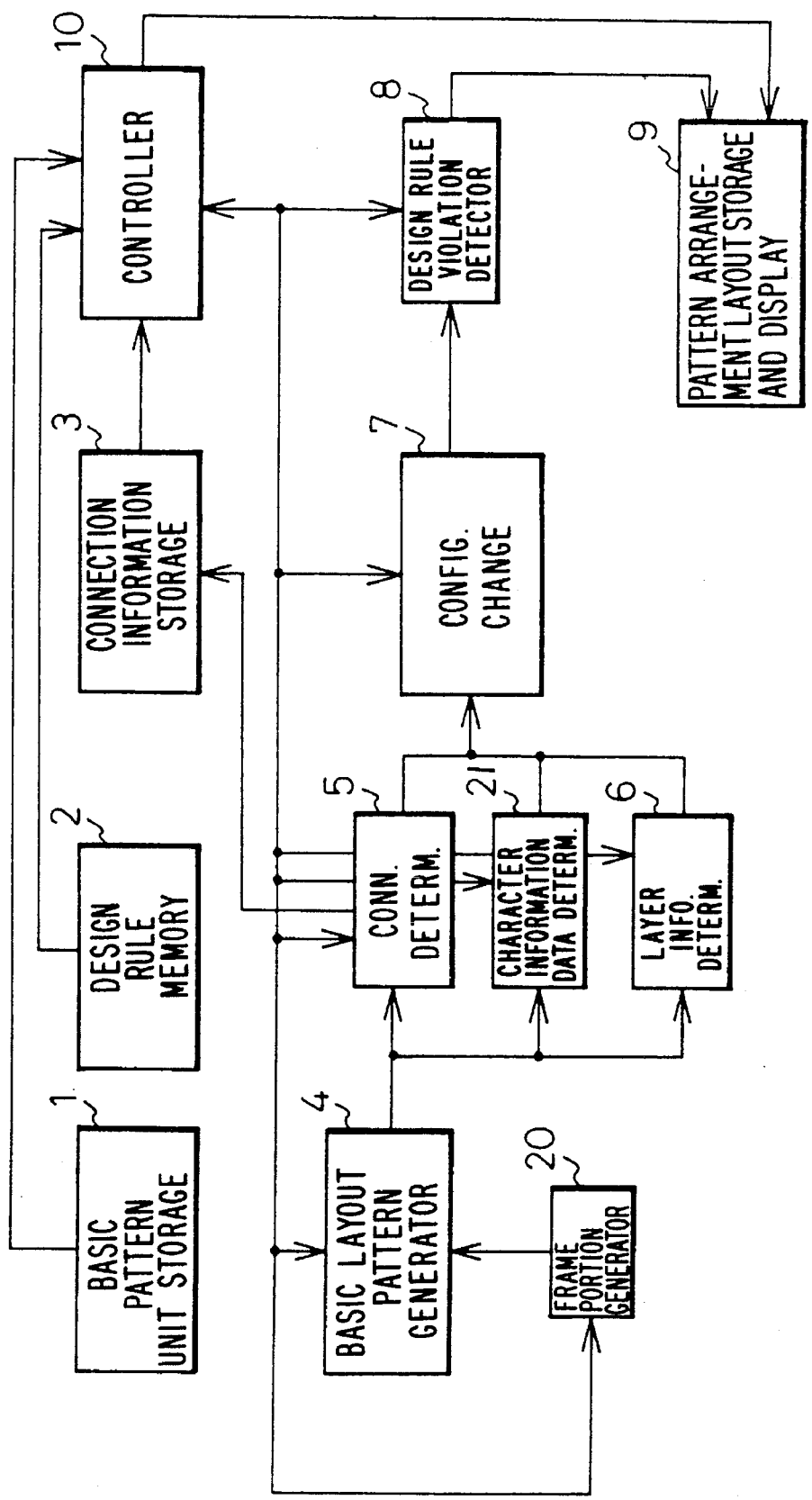
FIG. 6 is a block diagram for explaining a structure of a layout data conversion apparatus according to a preferred embodiment of the present invention.

In FIG. 6, there is illustrated a schematic structure of the preferred embodiment regarding the layout data conversion apparatus for carrying out the layout data conversion method of the present invention.

FIG. 6 is a block diagram showing an example of the layout data conversion apparatus of the present invention. The layout data conversion apparatus shown in FIG. 6 comprises basic pattern unit (basic layout pattern) storage means 1, design rule memory means 2, means for storing information about connection between basic pattern units 3, basic layout pattern generation means 4, connection determination means 5 for determining whether conductive portions are connected to each other, layer information determining means 6, element configuration change means 7, means for detecting and eliminating violation of design rules 8, means for storing and displaying layout pattern arrangement result information 9, and computation control means 10 for controlling operations of these means.

The basic pattern unit (basic layout pattern) storage means 1 is means which is referred to as "a cell library." The basic pattern unit storage means stores as basic cells, i.e., basic pattern units, which are a plurality of types of wiring structures and element structures forming a semiconductor integrated circuit such as a digital LSI which are different from each other. In designing a predetermined semiconductor integrated circuit, the basic pattern units which are stored in the storage means 1 are properly selected by an operator or automatically, and arranged in accordance with a predetermined arrangement instruction.

Figure 7B:
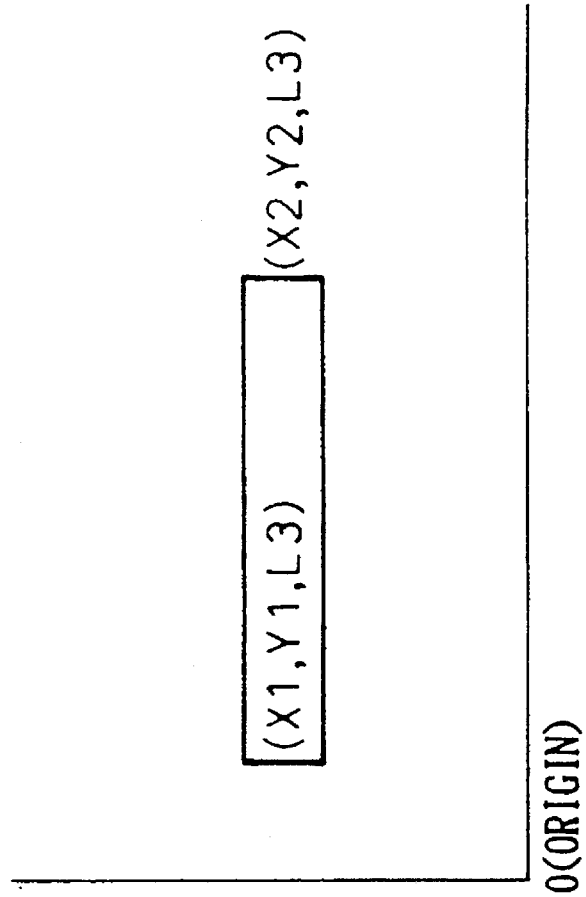
FIGS. 7A and 7B are views for explaining an example of a method of storing the configuration of a conductive portion according to the present invention.
Figure 7A:
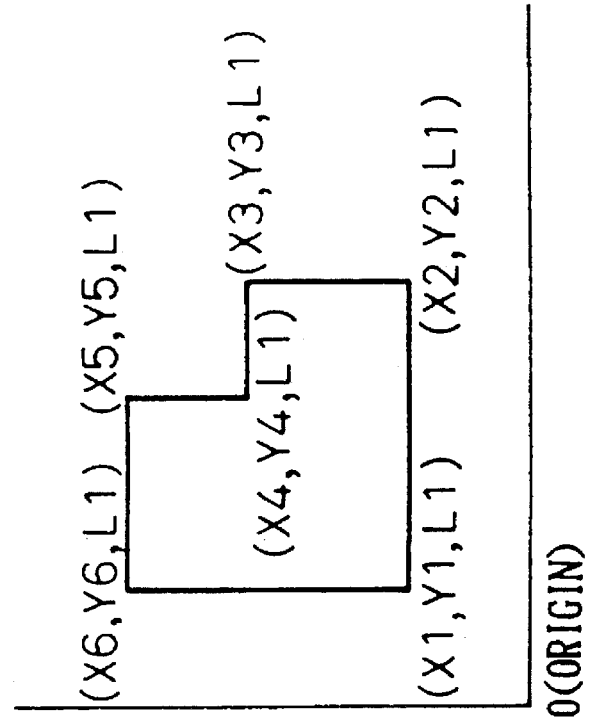

Information about the wiring and the elements which are stored in the basic pattern unit storage means 1, as shown in FIGS. 7(A) and 7(B), is stored as a combination of X and Y coordinate values of the respective corner points with respect to the origin (0), and layer information.

The layer information indicates in which layers of the basic pattern units the wiring, the elements, and the like are formed.

Further, although FIGS. 7(A) and 7(B) show a state in which positional information of the respective elements within separate basic pattern units (basic cells) is stored, the present invention allows that a plurality of basic pattern unit (basic cell) sets are disposed in a hierarchic structure and the positional information and the layer information of each element are stored.

In addition, the design rule memory means 2 stores rules which must not be violated in arranging the basic pattern units which are stored in the basic pattern unit storage means adjacent each other. Among these rules is a rule which determines whether it is allowable to arrange certain basic pattern units adjacent each other, and a rule which permits an adjacent arrangement of basic pattern units which can be arranged adjacent each other in only particular directions.

On the other hand, the means for storing information about connections between basic pattern units 3 is equipped with a function for storing which wiring portion is connected to which wiring portion between two basic pattern units which are arranged adjacent each other among the already arranged basic pattern units. In FIG. 8(A), there is illustrated a case where basic pattern units 11-1 to 11-4 are arranged next to each other in a straight line and certain components, i.e., wiring portions 12-1 to 12-4 are connected to each other while wiring portions 13-1 to 13-4 are not connected to each other.

In the means for storing information about connections between basic pattern units 3, as shown in FIG. 8(B) or 8(C), computation is performed based on the X and Y coordinate values and the layer information to yield a logical AND of boundary data (FIG. 8(B)) or bus data (FIG. 8(C)) o the wiring portions 12-1 and 12-2 of the basic pattern units 11-1 and 11-2 at a connection portion 14-1, it is determined whether wiring data are present at the same coordinates location in the same layer. If wiring data are present at the same location in the same layer, it is determined that the basic pattern units 11-1 and 11-2 are connected to each other and this result is stored in the means for storing information about connections between basic pattern units In this case, where the basic pattern units have a multilevel, multilayer hierarchic structure, such as between the wiring portions 12-1 and 12-2 of the basic pattern units 11-1 and 11-2, if the layer information (Ll to Ln) is different although the X, Y coordinates values re the same, it is determined that these wiring portions are not connected to each other.

In addition, in the present invention, as shown in FIG. 8(D), it is also determined that these wiring portions are connected to each other if the facing edge portions of the wiring portions overlap each other.

Further, in the present invention, it is determined that these wiring portions are connected to each other if at least one edge portion of the wiring portions, i.e., conductive portions, is connected to the afore-mentioned frame portions or other conductive portions of the adjacent basic pattern units.

Next, from a plurality of basic pattern units 11, which are selected from the basic pattern unit storage means 1 to design the predetermined semiconductor integrated circuit, and from the information which is stored in the design rule memory means 2, the basic layout pattern generation means 4 generates a basic layout pattern of the basic pattern units in accordance with an instruction which is received from the computation control means 10.

On the other hand, as mentioned earlier, the connection determination means 5 determines whether the components, i.e., the conductive portions 12-1 and 12-2 or 13-1 and 13-2 such as wiring portions are connected to each other between the basic pattern units 11-1 and 11-2 which are arranged adjacent each other. The result of the determination is stored in the means for storing information about connections between basic pattern units 3.

In addition, when the basic pattern units 11 are formed in a multilevel layer structure as described earlier, the layer information determining means 6 of the present invention assigns the coordinate location information and the layer information to the respective components which are formed in the basic pattern units 11, e.g., the conductive portions or predetermined portions of the elements. Based on the layer information, the layer information determining means 6 determines in which layers of the basic pattern units 11 the conductive portions or the elements, i.e., the conductive portions are formed.

Further, the element configuration change means 7 of the present invention performs reduction data conversion or shift data conversion on the initially generated basic layout pattern of the semiconductor integrated circuit such as a digital LSI. The means for detecting and eliminating violations of design rules 8 determines whether the arrangement rules regarding the basic pattern units which are stored in the design rule memory means 2 are violated in a layout pattern which is obtained as a result of data conversion performed by the element configuration change means 7. If there is violation of the arrangement rules, the means for detecting and eliminating violation of design rules 8 calls for an alarm to let an operator know of the violation so that the operator performs predetermined correction to eliminate the violation of the arrangement rules regarding the basic pattern units.

The result of this is displayed by the means for storing and displaying layout pattern arrangement result information 9.

Next, an explanation will be given concerning the preferred embodiment in which the layout data conversion method is carried out by the layout data conversion apparatus described above.

In the present invention, in designing a semiconductor integrated circuit which has a predetermined function, first, an operator selects the necessary basic pattern units from a plurality of types of basic pattern units which are stored in the basic pattern unit storage means 1. Then, in the basic layout pattern generation means 4, with reference to the predetermined rules which are stored in the design rule memory means 2, layout design data regarding an overall circuitry diagram are generated in accordance with instruction information given by the computation control means 10.

Following this, data conversion, for converting the basic layout pattern design data thus obtained into configuration and arrangement styles which are necessary as a final product, reduction or shift, is performed. The present invention is characterized in that in performing the data conversion, whether execution of the data conversion is possible is determined for each basic pattern unit, i.e., a basic cell. In performing data conversion on one component, unlike in the conventional method, the data conversion is performed on the components of all basic pattern units which will be affected by the data conversion of the one component, predetermined data conversion is completed only within the target basic pattern unit. Hence, the data conversion is very simple, making it possible to carry out precise data conversion in a short time.

In short, in the present invention, before the element configuration change means 7 of FIG. 6 performs a predetermined data conversion, at the connection determination means 5 and the layer information determining means 6, it is determined whether conductive portions of one basic pattern unit or component portions, i.e., element portions, are connected to corresponding component portions of other basic pattern units which are arranged adjacent to the one basic pattern unit. The element configuration change means 7 performs the data conversion only on components which are within the one basic pattern unit and which are determined not to be connected, i.e., conductive wiring portions or element portions.

More precisely, in the design data of a semiconductor integrated circuit formed by a plurality of basic pattern unit sets arranged adjacent each other, if a conductive portion which is formed in one layer of a first basic pattern unit is connected to a conductive portion which is formed in an optional layer of a second basic pattern unit which is arranged adjacent to the first basic pattern unit, the data conversion is not performed on all conductive portions including the conductive portion which is formed in the one layer of the first basic pattern unit, but the data conversion is performed on a conductive portion which is formed in another layer of the first basic pattern unit which is not connected to a conductive portion which is formed in an optional layer of any other basic pattern unit which is arranged adjacent to the first basic pattern unit.

Figure 1B:
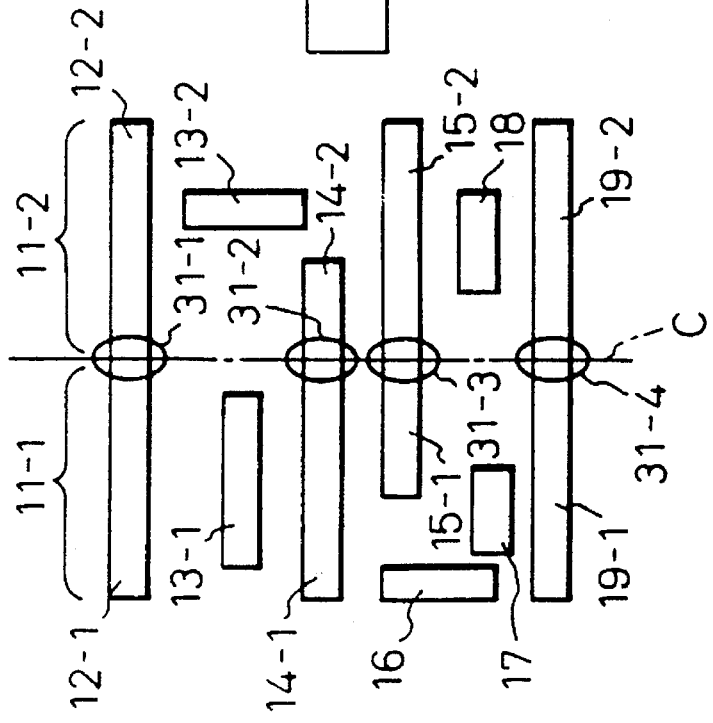

FIGS. 1(A) and 1(B) are block diagrams showing an actual example of data conversion according to such an embodiment. In the illustrated example, it is assumed that basic pattern units 11-1 and 11-2 are formed by one layer.

That is, since the basic pattern units 11-1 and 11-2 are arranged with their wiring 12-1 and 12-2 connected to each other at a portion C, as shown in FIG. 1(B), this wiring will not be converted during data conversion.

In a similar manner, since wiring 14-11, 15-1 and 19-1 of the basic pattern unit 11-1 are connected to wiring 14-2, 15-2 and 19-2 of the basic pattern unit 11-2, data conversion will not be performed on this wiring. However, since wiring 13-1 and 17 of the basic pattern unit 11-1 and wiring 13-2 and 18 of the basic pattern unit 11-2 are not connected to any one wiring of the adjacent basic pattern units but rather completed within these basic pattern units, data conversion would not affect the other adjacent basic pattern units. Therefore, necessary data conversion will be performed on this wiring.

FIG. 1(B) shows an example in which reduction is carried out to reduce the length or the width of the wiring portions.

In general, component portions which are in contact with the periphery of each respective basic pattern unit are very likely to be connected to component portions of the other adjacent basic pattern units. For this reason, it is desirable not to perform data conversion on the component portions which are in contact with the peripheries of the basic pattern units.

Hence, in FIG. 1, a wiring portion 16 of the first basic pattern unit 11-i as it is not converted by the data conversion.

In other words, in the layout data conversion method of the present invention, if a component portion of one basic pattern unit is connected to component portions of the other adjacent basic pattern units, the component portion of the one basic pattern unit will not be moved as a principle.

Next, description will be given of a case where basic pattern units are formed in a multilevel, multilayer structure. In such a case, even though X-Y coordinate value data regarding a predetermined component portion of one basic pattern unit 11-1 is taken in a plane is connected to or overlaps X-Y coordinate value data regarding a corresponding component portion of the other basic pattern unit 11-2, if the layer information are different, i.e., if the component portion of the first basic pattern unit 11-1 is formed in a first layer while the component portion of the second basic pattern unit 11-2 is formed in a second or a third layer, it is determined that the component portions are not directly connected to each other. Hence, it is permissible to perform predetermined data conversion on the component portions of these basic pattern units.

That is, in the element configuration change means 7 of the present invention, utilizing the information from the means for storing information about connection between basic pattern units 3 and the information from the layer information determining means 6, it is determined whether data conversion is to be performed on the predetermined component portions of the basic pattern units. If it is decided that the data conversion is permissible, the data conversion will be performed on these component portions.

In the present invention, as a preferred embodiment of the data conversion, reduction of the areas of the conductive portions is preferably performed.

Further, in the data conversion method of the present invention, the conductive portions of the basic pattern units are arranged in a first direction and a second direction which is perpendicular to the first direction, and the data conversion is a reduction of the widths of the conductive portions in the first or the second direction.

Next, explanation will be given on a structure of a wiring of a first layer of each basic pattern unit according to the first preferred embodiment of the present invention with reference to FIGS. 11(A) to 11(C), 12(A) to 12(C) and 13(A) to 13(C).

Figure 11A:
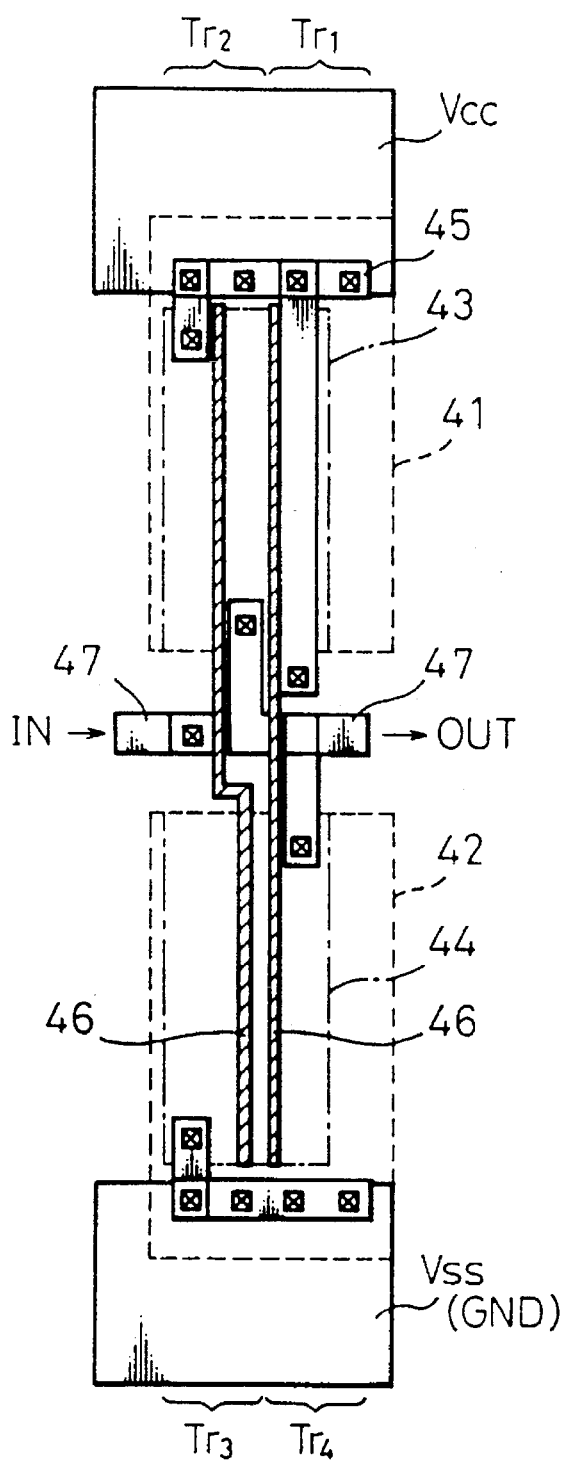
FIGS. 11A to 11C are plan views showing an example of the configuration of a wiring which is formed in a first layer in a basic pattern unit which is used in the present invention.
Figure 11B:
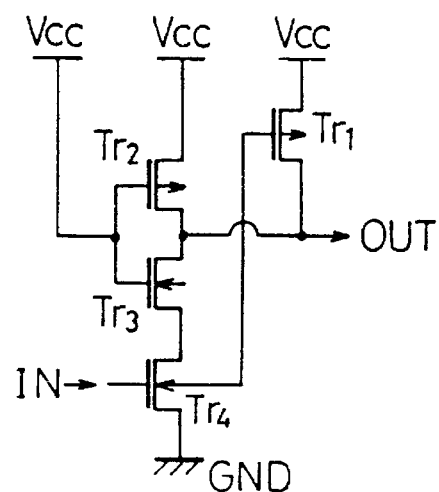
Figure 11C:
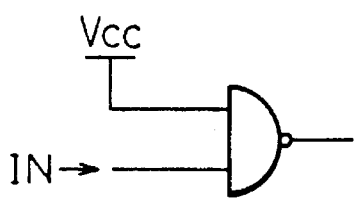
Figure 12A:
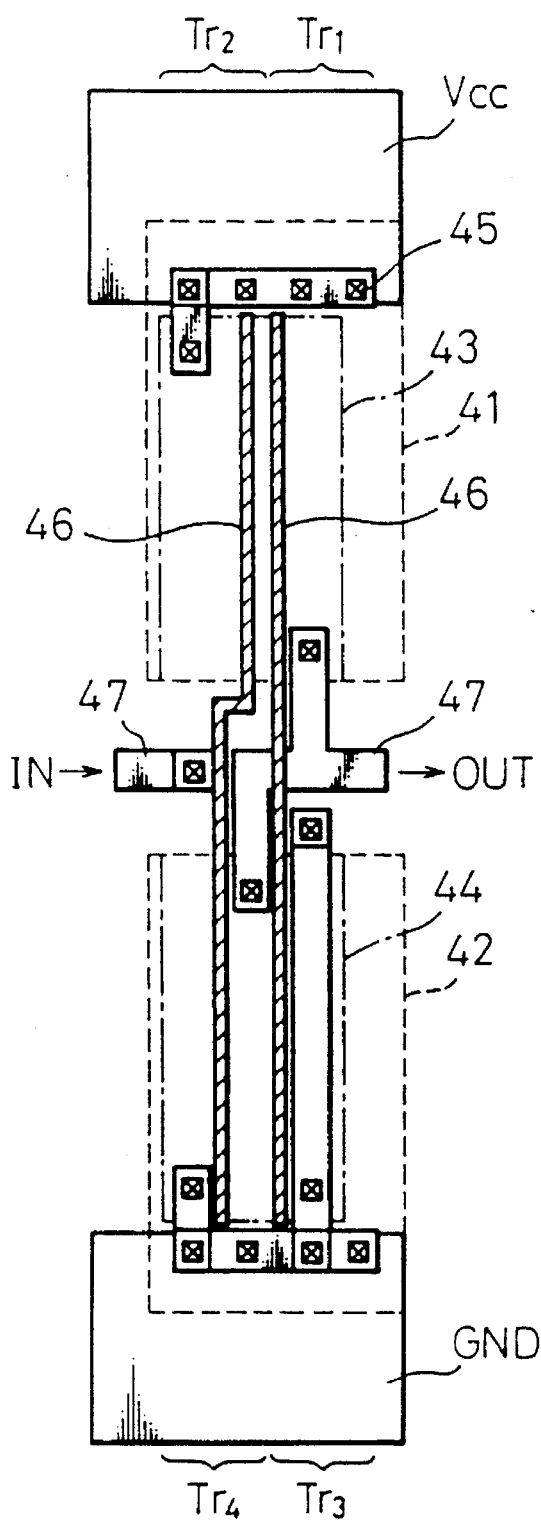
FIGS. 12A to 12C are plan views showing another example of the configuration of a wiring which is formed in a first layer in a basic pattern unit which is used in the present invention.
Figure 12B:
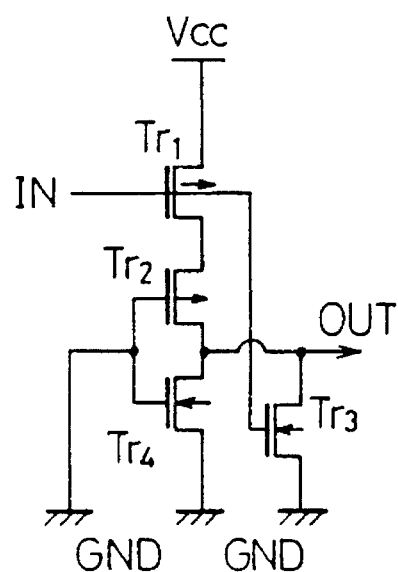
Figure 12C:
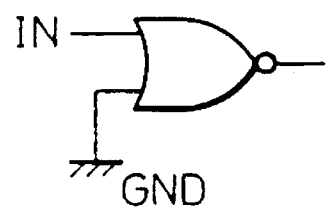
Figure 13A:
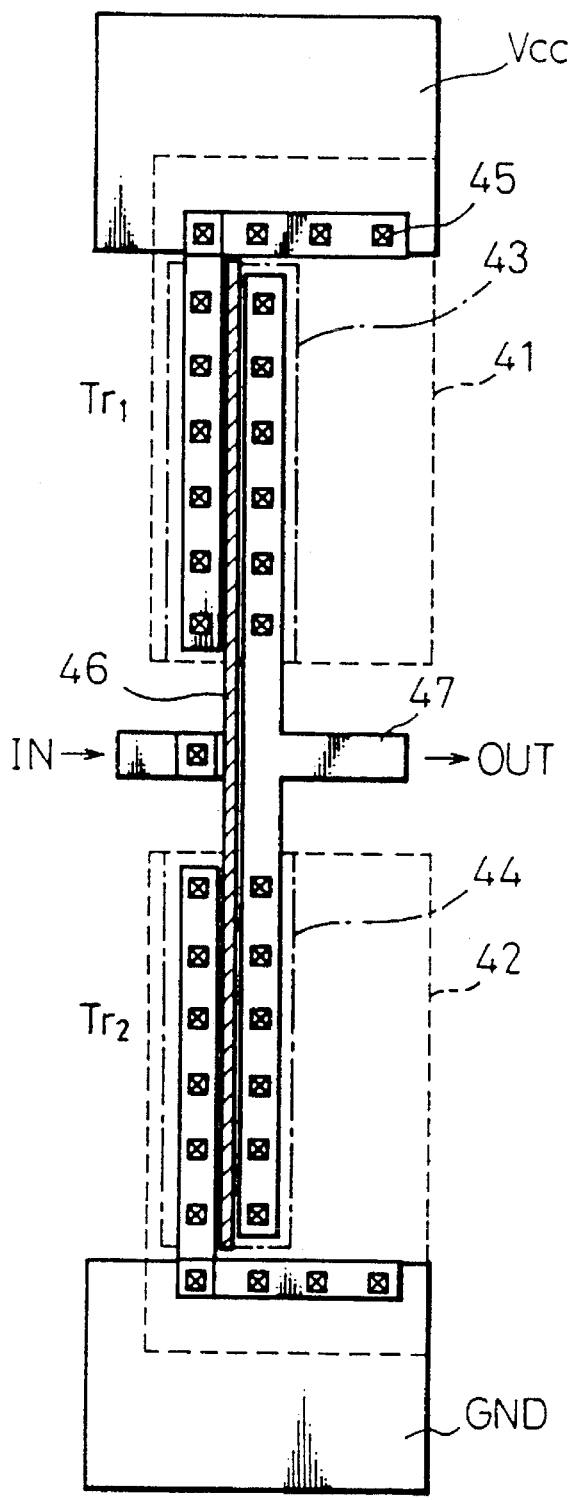
FIGS. 13A to 13C are plan views showing still another example of the configuration of a wiring which is formed in a first layer in a basic pattern unit which is used in the present invention.
Figure 13B:
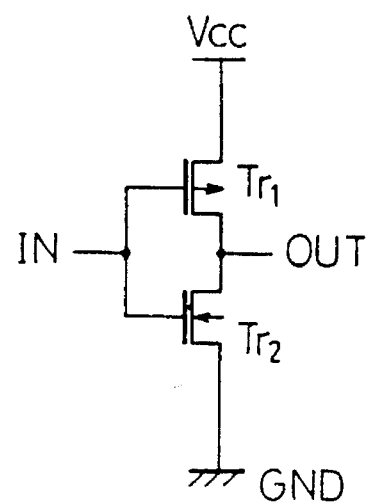
Figure 13C:
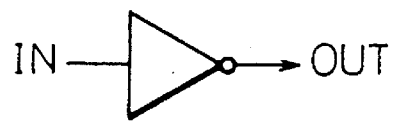

More precisely, FIGS. 11 to 13 are plan views showing the wiring portion which is disposed in the first layer, that is, the top layer of the basic pattern unit which is used in the present invention. FIGS. 11(A), 12(A) and 13(A) are wiring views, FIGS. 11(B), 12(B) and 13(B) are equivalent circuitry diagrams, and FIGS. 11(C), 12(C) and 13(C) show the logic symbols.

In FIG. 11(A), a two-input NAND gate circuit which is formed by four transistors Tr1 to Tr4 is shown. Between a high source voltage Vcc and a low source voltage Vss or a ground GND, an N well region 41 and a P well region 42 are disposed. In the N well region 41, a P-type diffusion region 43 is formed while an N-type diffusion region 44 is formed in the P well region 42. A gate 46 which is formed by a wiring layer 48 and polysilicon is disposed in a manner as that shown in FIG. 11(A).

A contact portion is indicated at a reference numeral 45, an input terminal is indicated at a reference numeral 47-1, and an output terminal is indicated at a reference numeral 47-2.

On the other hand, in FIG. 12(A), there is illustrated a two-input NOR gate circuit which is formed by four transistors Tr1 to Tr4. Between a high source voltage Vcc and a low source voltage Vss or a ground GND, an N well region 41 and a P well region 42 are disposed. In the N well region 41, a P-type diffusion region 43 is formed while an N-type diffusion region 44 is formed in the P well region 42. A gate 46 which is formed by a wiring layer 48 and polysilicon is disposed in a manner as that shown in FIG. 12(A).

In FIG. 12(A), a contact portion is indicated at a reference numeral 45, an input terminal is indicated at a reference numeral 47-1, and an output terminal is indicated at a reference numeral 47-2.

Further, in FIG. 13(A), there is shown an invertor circuit which is formed by two transistors Tr1 and Tr2. Between a high source voltage Vcc and a low source voltage Vss or a ground GND, an N well region 41 and a P well region 42 are disposed. In the N well region 41, a P-type diffusion region 43 is formed while an N-type diffusion region 44 is formed in the P well region 42. A gate 46 which is formed by a wiring layer 48 and polysilicon is disposed in a manner such as that shown in FIG. 12(A).

In FIG. 13(A), a contact portion is indicated at a reference numeral 45, an input terminal is indicated at a reference numeral 47-1, and an output terminal is indicated at a reference numeral 47-2.

Next, the layout data conversion method according to the second aspect of the present invention will be described.

In the layout data conversion method according to the first aspect of the present invention, for each basic pattern unit which is used, it is determined whether component portions such as conductive portions which form wiring portions or element portions of one basic pattern unit are connected to corresponding component portions of other basic pattern units which are arranged adjacent to this particular basic pattern unit. However, in the second aspect of the present invention, independently of basic pattern units, an imaginary frame portion having a predetermined region is set in one basic pattern unit or a group of successive basic pattern units, and it is determined whether the periphery of the frame portion and component portions which is located within the basic pattern unit are connected to each other. As is the same with component portions which are connected to the frame portion, the data conversion will not be performed but will be performed only on component portions which are not connected to the frame portion.

More particularly, in design data for a semiconductor integrated circuit formed by a plurality of basic pattern unit sets arranged adjacent each other, if a conductive portion which is formed in one layer of a first basic pattern unit is connected to the imaginary frame portion of the first basic pattern unit, the data conversion is not performed on all conductive portions including the conductive portion which is formed in the one layer of the first basic pattern unit, but the data conversion is performed on a conductive portion which is formed in other another layer of the first basic pattern unit which is not connected to the imaginary frame portion of the first basic pattern unit.

The frame portion can be set so as to have any desired region both inside and outside a basic pattern unit as shown in FIG. 2. It is possible that an operator selects and determines the frame portion so that the frame portion has dimensions which are appropriate for effectively performing computation of the data conversion.

In addition, since frame portion data are provided imaginarily, it is needless to mention that when a predetermined semiconductor integrated circuit is completed after computation and is displayed on a display apparatus, the frame portion information data are deleted in order not to be displayed.

To carry out the second aspect of the present invention, in the block diagram of FIG. 6, frame portion generation means 20 is preferably disposed. At the same time, the connection determination means 5 is preferably equipped with a frame portion connection determination function for determining whether component portions of the respective basic pattern units are connected to the frame portions.

It is to be noted that in the layout data conversion method according to the present invention, in determining whether component portions are connected to the periphery of the basic pattern unit or component portions of adjacent basic pattern units and in determining whether the component portions are connected to the frame portion if the frame portion is provided, if at least one edge portion of the component portions is connected to the frame portion or the periphery of the basic pattern unit or the component portions of the other adjacent conductive portions, it is determined that these component portions are connected to each other.

Now, the layout data conversion method according to the third aspect of the present invention will be described in detail.

That is, as described earlier, in the layout data conversion method according to the third aspect of the present invention, in a case where character information data are present in the respective basic pattern units, it is determined whether the data conversion is to be performed on component portions of the basic pattern units in which the character information data are included.

Generally speaking, character information data such as IN, OUT, VCC, VSS are printed in the basic pattern units in most cases. Most character information data represents the location of an input/output terminal, a power source terminal and the like. If the positions of such character information data are moved without consideration, it is very likely to cause malfunction of the semiconductor integrated circuit. Hence, basically, the data conversion is not performed on component portions which include the character information data.

More precisely, in the character information data, a position (point) is stored as X-Y coordinate value data so that the data conversion will not be performed on a component portion of a predetermined pattern unit which includes the coordinates location data of the character information data. Further in a case where the basic pattern units are formed in a multilayer structure, the data conversion will not be performed on component portions which are formed in each layer and which include the X-Y coordinate value data of the character information data, independently of a difference of the layers.

That is, if character information data are registered in the respective basic pattern units or in at east a portion of layout data which are formed by combining a plurality of the basic pattern units, with respect to the conductive portions of the basic pattern units or the layout data which are formed by combining the basic pattern units in which the character information data are registered, the data conversion is not performed on all conductive portions independently of differences in layers which include positional information in which coordinate value data of the character information are set, while with respect to conductive portions of all basic pattern units or the layout data which are formed by combining the basic pattern units which do not include the positional information in which coordinate value data of the character information are set, independently of differences in layers, the data conversion is performed on a conductive portion which is connected to the conductive portions of the adjacent basic pattern units of the layout data or conductive portions other than a conductive portion which is in contact with the imaginary frame portion.

To carry out the layout data conversion method of the third aspect of the present invention, as shown in the block diagram of FIG. 6, character information data determining means 21 is preferably disposed which determines the existence of the character information and whether the component portions which include the coordinates location data as the character information data are present in the basic pattern unit. An output of the character information data determining means 21 is sent to the element configuration change means 7. Therefore, as described earlier, if any one of the component portions which are included in a predetermined basic pattern unit includes the coordinates location data as the character information data, the data conversion will not be performed on such component portions.

The following is a summary of basic algorithms regarding the data conversion of component portions of basic pattern units used in the layout data conversion methods according to the first to the third aspects of the present invention.

That is, (1) The data conversion can be performed on component portions which are not connected to the imaginary frame portion, which is formed at the periphery of a basic pattern unit or in the basic pattern unit, or to component portions of other adjacent basic pattern units and which do not include the coordinate data of the character information data;

(2) Independently of inclusion of the coordinate data of the character information data, the data conversion is not performed on component portions which are connected to the imaginary frame portion, which is formed at the periphery of a basic pattern unit or in the basic pattern unit, or to component portions of other adjacent basic pattern units and all other component portions which are formed in the same layer in which these component portions are formed;

(3) The data conversion can be performed on component portions which are formed in a layer which is different from the layer which includes the component portions connected to the imaginary frame portion, which is formed at the periphery of a basic pattern unit or in the basic pattern unit, or to component portions of other adjacent basic pattern units, and which are not connected to the imaginary frame portion, which is formed at the periphery of a basic pattern unit or in the basic pattern unit, or to component portions of other adjacent basic pattern units;

(4) The data conversion is not performed on component portions which include the same character information data even though the component portions are formed in different layers from each other; and (5) The data conversion can be performed on component portions which are formed in the same layer including component portions including the character information data, but which do not include the character information data, and which are not connected to the imaginary frame portion, which is formed at the periphery of a basic pattern unit or in the basic pattern unit, or to component portions of other adjacent basic pattern units.

FIG. 9 shows some examples regarding component portions on which the data conversion of the present invention can be performed.

More precisely, in FIG. 9(A) assumes that a frame portion 50 is properly formed within a basic pattern unit 11-1. In the basic pattern unit 11-1, a first conductive portion 91 is formed in a first layer L1 and the both ends of the conductive portion 91 are connected to the frame portion 50. A second conductive portion 92 formed in a second layer L2 is not connected to any frame peripheral portion within the frame portion 50. Further, a third conductive portion 93 is formed in a third layer L3 but is not connected to any frame peripheral portion within the frame portion 50. The third conductive portion 93 includes the character information data M. As to such a basic pattern unit, the data conversion can be performed only on the second conductive portion 92.

In FIG. 9(B), within the frame portion 50 which is properly formed in the basic pattern unit 11-1, a first conductive portion 94 is formed in the first layer L1, while a second conductive portion 95 is formed in the second layer L2 so as to be perpendicular to the first conductive portion 94. Further, a third conductive portion 96 is arranged with a predetermined angle with respect to both the first and the second conductive portions 94 and 95 in the third layer L3. The first to the third conductive portions 94 to 96 are not connected to the frame portion 50. The character information data M are present at an intersection portion of the first to the third conductive portions 94 to 96. In addition, in the second layer, a fourth conductive portion 97 is formed without being connected to the frame portion 50. In the third layer, a fifth conductive portion 98 is formed without being connected to the frame portion 50. In such a case, the data conversion can be performed only on the fourth and the fifth conductive portions 97 and 98.

In the example shown in FIG. 9(C), within the frame portion 50 which is properly formed in the basic pattern unit 11-1, a first conductive portion 101 is formed in the first layer L1 but is not connected to the frame portion 50.

On the other hand, in the second layer L2, a second conductive portion 102 which is connected to the frame portion 50 and a third conductive portion 103, not connected to the frame portion 50 are formed. In the third layer L3, a fourth conductive portion 104 is formed perpendicularly to the second conductive portion 102 not connected to the frame portion 50, and a fifth conductive portion 105 is formed not connected to the frame portion 50. The character information data M are present at an intersection portion of the second and the fourth conductive portions 102 and 104. In such a case, the data conversion can be performed only on the first and the fifth conductive portions 101 and 105.

In the example shown in FIG. 9(D), there is illustrated an arrangement of a conductive portion which is approximately the same as that shown in FIG. 9(C). However, the character information data M are present not at an intersection portion of the second and the fourth conductive portions 102 and 104 but in the first conductive portion 101. In such an arrangement, the data conversion can be performed only on the fourth and the fifth conductive portions 104 and 105 which are formed in the third layer.

Next, procedures of carrying out the layout data conversion method of the present invention as above will be described with reference to the flow chart shown in FIGS. 10(A) and 10(B).

The preferred embodiment below will be described in relation to an example where the frame portion 50 is formed in a basic pattern unit. However, it is clear from the foregoing that the present invention is not limited in where such a frame portion is formed.

To the beginning of the layout data conversion method according to the present invention, at a step (1), basic pattern units are selected from the basic pattern unit storage means 1. At a step (2), based on the basic pattern units which were selected, utilizing the information stored in the design rule memory means 2, the frame portion generation means 20 and the like, the basic layout pattern generation means 4 generates a temporary basic layout pattern by computing in accordance with an instruction which is received from the computation control means 10.

At a subsequent step (3), in light of data which are set in the frame portion generation means 20, it is determined whether component portions, for example, conductive portions which are disposed within the respective frame portions 50 are connected to the respective frame portions 50. If a result of the determination is YES, i.e., if component portions are connected to a certain frame portion 50, the sequence proceeds to a step (4) at which whether the character information data are present within that frame portion 50 is determined.

If a result of the determination is YES at the step (4), that is, if character information data exists in the certain frame portion 50, the sequence proceeds to a step (5) at which it is determined whether there is a conductive portion which includes the character information data. If a result of the determination is NO, i.e., if there is no conductive portion including the character information data within the frame portion, the sequence proceeds to a step (6) at which it is determined whether the target conductive portions are formed in the layer in which the conductive portions connected to the frame portion 50 are formed.

As described earlier, this determination is performed by the layer information determining means 6 based on the X-Y coordinates values and the layer information Ln of each conductive portion.

If a result of the determination is NO at the step (6), that is, if the target conductive portions are not formed in the layer in which the conductive portions connected to the frame portion 50 are formed, the sequence proceeds to a step (7) at which the data conversion is performed on the target conductive portions.

On the other hand, if a result of the determination is YES at the step (6), that is, if target conductive portions are formed in the layer in which the conductive portions connected to the frame portion 50 are formed, the sequence proceeds to a step (8) so that the data conversion of the target conductive portions is prohibited. In this case, if the prohibited conductive portions are conductive portions which were not formed in the layer in which the conductive portions connected to the frame portion 50 are formed, which are not connected to the frame portion 50, and which do not include the character information data, the data conversion can be performed.

On the other hand, if a result of the determination is YES at the step (5), that is, if the conductive portions which include the character information data are present in the frame portion, the sequence proceeds to a step (9) at which it is determined whether the target conductive portions are formed in the same layer which includes the conductive portions which are connected to the frame portion 50.

If a result of the determination is YES at the step (9), that is, if the target conductive portions are formed in the same layer which include the conductive portions which are connected to the frame portion 50, the sequence proceeds to a step (10). As a result, the data conversion is not performed on both the conductive portions which include the character information data and the conductive portions which are formed in the same layer as that including the conductive portions connected to the frame portion. Rather, the data conversion is performed only on the conductive portions which do not include the character information data, which are formed in a layer different from the layer including the conductive portions connected to the frame portion, and which are not connected to the frame portion.

On the other hand, if a result of the determination is NO at the step (9), that is, if the target conductive portions are not formed in the same layer as that including the conductive portions connected to the frame portion 50, the sequence proceeds to a step (11) so that execution of the data conversion is allowed on all conductive portions which are not connected to the frame portion except for those conductive portions which include the character information data.

Further, if a result of the determination is NO at the step (4), that is, if the character information data does not exist within the frame portion, the sequence proceeds to a step (12) at which it is determined whether the target conductive portions are formed in the same layer as that including the conductive portions which are connected to the frame portion 50. If a result of the determination is YES at the step (12), that is, if the target conductive portions are formed in the same layer as that including the conductive portions which are connected to the frame portion 50, the sequence proceeds to the aforementioned step (8) and the procedures above are performed.

If a result of the determination is NO at the step (12), that is, if the target conductive portions are not formed in the same layer as that including the conductive portions which are connected to the frame portion 50, the sequence proceeds to the afore-mentioned step (7) and the procedures above are performed.

In addition, if a result of the determination is NO at the step (3), that is, if there are not conductive portions which are connected to the frame portion 50, the sequence proceeds to the step (13) at which whether the character information data are present within that frame portion is determined.

If a result of the determination is YES at the step (13), that is, if there is character information data present within the frame portion 50, the sequence proceeds to step (11). As a result, execution of the data conversion is permitted on all the other conductive portions which are formed in the same layer as that including the conductive portions which are connected to the frame portion.

Meanwhile, as to conductive portions which are formed in different layers, if they do not include the character information data and are not connected to the frame portion, the data conversion can be performed.

On the other hand, if a result of the determination is NO at the step (13), the sequence proceeds to step (7) so that execution of the data conversion is allowed on all target conductive portions. As to conductive portions which are formed in different layers, if they are not connected to the frame portion, the data conversion can be performed.

The computation procedures described above are performed by the element configuration change means 7 in accordance with output data from the connection determination means 5, the character information data determination means 21, the layer information determining means 6, the means for storing information about connection between basic pattern units 3 and the like. Following this, the sequence proceeds to a step (16) (not shown in FIG. 10B) where it is determined whether conductive portions which were corrected by the computation procedures above violate the design rules which are stored in the design rule memory means 2. If there is violation, the sequence returns to the step (1) to design the layout pattern once again.

When the violation of the design rules has been eliminated, or when the violation of the design rules has become smaller than a predetermined level, the sequence proceeds to a step (17) (not shown) at which the result is displayed on the means for storing and displaying layout pattern arrangement result information 9.

Thus, according to the present invention, in using data which were used in designing a previous circuit for the purpose of performing predetermined data conversion, no disconnection of wirings and the like will be created and therefore manual correction by an operator is not necessary. Hence, designing of a new circuit is performed with a decreased number of designing steps.

We claim:

1. A layout data conversion method, comprising:

performing a predetermined data conversion to correct design data of a semiconductor integrated circuit which is designed by joining basic pattern units which are selected from a pattern unit storage part in which a plurality of basic pattern units having different conductive arrangement patterns are stored, the data conversion being achieved by performing reduction computation to reduce the configurations of the conductive portions or shift computation to change the widths of the conductive portions of the basic pattern units, so as reduce the areas of the conductive portions;

analyzing the design data;

if conductive portions of adjacent basic pattern units are connected to each other, omitting the data conversion on the conductive portions;

omitting the data conversion on a portion of the conductive portion of one of the adjacent basic pattern units which is in contact with the conductive portion of the other one of the adjacent basic pattern units, and performing the data conversion by performing a layout data conversion by changing coordinate values of the design data for a portion of the conductive portion of one of the adjacent basic pattern units which is not in contact with the conductive portion of the other one of the adjacent basic pattern units.

2. A layout data conversion method in accordance with claim 1, wherein the basic pattern units have a multilevel, multilayer hierarchic structure.

3. A layout data conversion method in accordance with claim 2, wherein after analyzing the design data of a semiconductor integrated circuit formed by a plurality of basic pattern unit sets arranged adjacent each other;

if a conductive portion which is formed in one layer of a first basic pattern unit is connected to a conductive portion which is formed in an optional layer of a second basic pattern unit which is arranged adjacent to the first basic pattern unit, the data conversion is not performed on all conductive portions including the conductive portion which is formed in the one layer of the first basic pattern unit, but the data conversion is performed on a conductive portion which is formed in another layer of the first basic pattern unit which is not connected to a conductive portion which is formed in an optional layer of any other basic pattern unit which is arranged adjacent to the first basic pattern unit.

4. A layout data conversion method, comprising:

performing a predetermined data conversion to correct design data of a semiconductor integrated circuit which is designed by joining basic pattern units which are selected from a pattern unit storage part in which a plurality of basic pattern units having different conductive arrangement patterns are stored, the data conversion being achieved by performing reduction computation to reduce the configurations of the conductive portions or shift computation to change the widths of the conductive portions of the basic pattern units, so as to reduce the areas of the conductive portions;

forming an imaginary frame portion which surrounds each basic pattern unit of the design data, and if there is a conductive portion which is located within and in contact with the imaginary frame portion, omitting data conversion on this conductive portion but performing data conversion by changing coordinate values of the design data for a conductive portion which is not in contact with the imaginary frame portion.

5. A layout data conversion method in accordance with claim 4, wherein the basic pattern units have a multilevel, multilayer hierarchic structure.

6. A layout data conversion method in accordance with claim 4, wherein in design data of a semiconductor integrated circuit formed by a plurality of basic pattern unit sets arranged adjacent each other:

if a conductive portion which is formed in one layer of a first basic pattern unit is connected to the imaginary frame portion of the first basic pattern unit, the data conversion is not performed on all conductive portions including the conductive portion which is formed in the one layer of the first basic pattern unit, but the data conversion is performed on a conductive portion which is formed in another layer of the first basic pattern unit which is not connected to the imaginary frame portion of the first basic pattern unit.

7. A layout data conversion method in accordance with claim 6, wherein the conductive portions are wiring.

8. A layout data conversion method in accordance with claim 6, wherein if character information data are registered in the respective basic pattern units or in at least a portion of layout data which are formed by combining a plurality of the basic pattern units, with respect to the conductive portions of the basic pattern units or the layout data which are formed by combining the basic pattern units in which the character information data are registered, the data conversion is not performed on all conductive portions independently of differences in layers which include positional information in which coordinates value data of the character information are set, while with respect to conductive portions of all basic pattern units or the layout data which are formed by combining the basic pattern units which do not include the positional information in which coordinates value data of the character information are set, independently of differences in layers, the data conversion is performed on a conductive portion which is connected to the conductive portions of the adjacent basic pattern units of the layout data or conductive portions other than a conductive portion which is in contact with the imaginary frame portion.

9. A layout data conversion method in accordance with claim 1 or 4, wherein the conductive portions of the basic pattern units are arranged in a first direction and a second direction which is perpendicular to the first direction, and the data conversion is reduction of the widths of the conductive portions in the first or the second direction.

10. A layout data conversion apparatus, comprising:

basic pattern unit storage means;

design rule memory means;

means for storing information about connection between basic pattern units;

basic layout pattern generation means;

connection determination means for determining whether conductive portions are connected to each other;

layer information determining means;

element configuration change means for changing coordinate values of layout data to reduce the areas of selected conductive potions;

means for detecting and eliminating violation of design rules;

means for storing and displaying layout pattern arrangement result information; and computation control means for controlling operations of said basic pattern unit storage means, design rule memory means, means for storing connection information, basic layout pattern generation means, connection determination means, layer information determining means, element configuration change means, means for detecting and eliminating, and means for storing and displaying.

11. A layout data conversion apparatus, comprising:

basic pattern unit storage means;

basic layout pattern information memory means;

design rule memory means;

means for storing information about connection between basic pattern units;

basic layout pattern generation means;

frame portion setting means;

connection determination means for determining whether conductive portions are connected to each other;

layer information determining means;

element configuration change means for changing coordinate values of layout data to reduce the areas of selected conductive portions;

means for detecting and eliminating violation of design rules;

means for storing and displaying layout pattern arrangement result information; and computation control means for controlling operations of said basic pattern unit storage means, design rule memory means, means for storing connection information, basic layout pattern generation means, connection determination means, layer information determining means, element configuration change means, means for detecting and eliminating, and means for storing and displaying.

12. A method for converting design data for a semiconductor integrated circuit designed by joining basic pattern units having different conductive patterns arranged therein, comprising:

analyzing the design data to determine if conductive patterns of adjacent basic pattern units are connected to each other; and selectively performing data conversion to reduce the areas of selected conductive patterns based on said analyzing step, by changing coordinate values of the design data for selected conductive patterns.

13. A method as set forth in claim 12, wherein said analyzing step comprises:

forming an imaginary frame portion around each basic pattern unit; and determining, for each imaginary frame portion, whether one of the conductive patterns is in contact with the imaginary frame portion.

\* \* \* \* \*